(12) United States Patent
Troost et al.

(10) Patent No.: US 7,500,218 B2
(45) Date of Patent: Mar. 3, 2009

(54) LITHOGRAPHIC APPARATUS, METHOD, AND COMPUTER PROGRAM PRODUCT FOR GENERATING A MASK PATTERN AND DEVICE MANUFACTURING METHOD USING SAME

(75) Inventors: Kars Zeger Troost, Waalre (NL); Johannes Jacobus Matheus Baselmans, Oirschot (NL); Karel Diederick Van Der Mast, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 853 days.

(21) Appl. No.: 10/919,532

(22) Filed: Aug. 17, 2004

(65) Prior Publication Data

US 2006/0040187 A1 Feb. 23, 2006

(51) Int. Cl.
*G06F 17/50* (2006.01)
(52) U.S. Cl. ............................... 716/21; 716/4; 716/19
(58) Field of Classification Search ........................ None
See application file for complete search history.

(56) References Cited

U.S. PATENT DOCUMENTS

| | | | |
|---|---|---|---|
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2002/0102479 A1 | 8/2002 | Cutter et al. |

(Continued)

FOREIGN PATENT DOCUMENTS

DE    199 14 583 A1    10/2000

(Continued)

OTHER PUBLICATIONS

English translation of Korean Office Action, dated Oct. 16, 2006, for KR Patent Application No. 10-2005-0075272, 9 pages.

(Continued)

*Primary Examiner*—Leigh Marie Garbowski
(74) *Attorney, Agent, or Firm*—Sterne, Kessler, Goldstein & Fox P.L.L.C.

(57) ABSTRACT

Grayscale Optical Proximity Correction device features are added to a mask pattern by convoluting the device features with a two-dimensional correction kernel or two one-dimensional correction kernels to generate grayscale OPC features. The resulting pattern may be used in a projection lithography apparatus having a programmable patterning means that is adapted to generate three or more intensity levels. An iterative process of simulating an aerial image that would be produced by the pattern, comparing the simulation to the desired pattern, and adjusting the OPC features may be used to generate an optimum pattern for projection.

29 Claims, 5 Drawing Sheets

U.S. PATENT DOCUMENTS

| | | |
|---|---|---|
| 2002/0152452 A1 | 10/2002 | Socha |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| EP | 1 235 103 A2 | 8/2002 |
| EP | 1 424 596 A2 | 6/2004 |
| EP | 1 454 194 | 9/2004 |
| EP | 1 628 157 A1 | 2/2006 |
| JP | 2001-281836 A | 10/2001 |
| JP | 2002-333700 A | 11/2002 |
| JP | 2002-351051 A | 12/2002 |
| JP | 2003-162041 A | 6/2003 |
| JP | 2003-215780 A | 7/2003 |
| JP | 2004-012722 A | 1/2004 |
| KR | 2002-0070130 | 9/2002 |
| WO | WO 98/33096 | 7/1998 |
| WO | WO 98/38597 | 9/1998 |
| WO | WO 99/27420 A1 | 6/1999 |
| WO | WO 03/052516 A1 | 6/2003 |
| WO | WO/03052516 | 6/2003 |

OTHER PUBLICATIONS

European Search Report for Appln. No. 05254979.7-2222, mailed Nov. 25, 2005, 7 pages.

Office Action, dated Jun. 14, 2007, for European Application No. 05 254 979.7-1226, 5 pgs.

Examination for European Application No. 05 254 979.7-1226 mailed Feb. 13, 2008, 5 pgs.

Schneider et al., "Compensation of long-range process effects on photomasks by design data correction", SPIE vol. 4889, 2002, pp. 59-66.

Soon Ho Kim, "Mask process proximity correction for next-generation mask fabrication", J. Vac. Sci. Technol. B 21(6), 2003, pp. 3041-3045.

Pati et al., "Exploiting Structure in Fast Aerial Image Computation for Integrated Circuit Patterns", IEEE Transactions on Semiconductor manufacturing, vol. 10, Nr. 1, 1997, pp. 62-74, XP2256517.

Translation of Office Action for Japanese Patent Application No. 2005-235896 mailed Nov. 18, 2008, 3 pgs.

English abstract for Japanese Publication No. JP 2003-521720T published Jul. 15, 2003, 1 pg.

LITHOGRAPHIC APPARATUS, METHOD, AND COMPUTER PROGRAM PRODUCT FOR GENERATING A MASK PATTERN AND DEVICE MANUFACTURING METHOD USING SAME

BACKGROUND OF THE INVENTION

1. Field of the Invention

The present invention relates to a lithographic apparatus, a method of generating a mask pattern, a device manufacturing method, a computer-readable storage medium storing a program for generating a mask pattern.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

In projection lithography the image printed on a substrate can be improved by adding optical proximity correction (OPC) features to the desired pattern. The OPC features are intended not to appear in the developed image themselves, but to affect the shape of the pattern features so that when developed the pattern features are closer to the desired pattern. They may also be used to bring the process windows of features of different pitches closer together to enable features of several different pitches to be printed in a single exposure. Known types of OPC features include scattering bars, serifs, hammerheads, and the like.

A binary mask (e.g., a chrome pattern on a quartz substrate) only allows for binary OPC features. To prevent the OPC features appearing in the developed pattern, they are made sub-resolution. For example, the OPC features are made to have a width less than a wavelength of exposure radiation in the case of scattering bars, so that the contrast in the projected image is less than a resist threshold. While known OPC features have been very successful in enabling features of critical dimension (CD) much less than the exposure wavelength (low k1) to be printed, further improvements would be desirable.

Therefore, what is needed is an improved method of providing Optical Proximity Correction features in lithography.

SUMMARY OF THE INVENTION

According to an embodiment of the present invention, there is provided a method of generating a mask pattern for projection comprising the steps of receiving a device pattern representing features to be printed and generating a mask pattern. The mask pattern comprises device features having a first intensity level against a background having a second intensity level and at least one correction feature having a third intensity level. The third intensity level is between the first and second intensity levels.

According to another embodiment of the present invention, there is provided a device manufacturing method comprising the steps of receiving a device pattern representing features to be printed and generating a mask pattern comprising device features having a first intensity level against a background having a second intensity level and at least one correction feature having a third intensity level. The third intensity level is between the first and second intensity levels. The method also comprises the steps of providing a substrate, providing a beam of radiation using an illumination system, using a patterning array of individually controllable elements to spatially modulate the beam according to the mask pattern, and projecting the patterned beam of radiation onto a target portion of the substrate.

In a further embodiment, the present invention provides a computer program product comprising a computer useable medium having a computer program logic recorded thereon for controlling at least one processor, the computer program logic comprising computer program code devices that perform operations similar to the method and devices in one or more of the above embodiments.

In a still further embodiment of the present invention, there is provided a lithographic apparatus comprising an illumination system, a patterning array of individually controllable elements, a substrate table, a projection system, and a controller. The illumination system supplies a beam of radiation. The patterning array of individually controllable elements serves to spatially modulate the beam. The substrate table supports a substrate. The projection system projects the patterned beam onto a target portion of the substrate. The controller controls the patterning array, so that its elements adopt states representing a projection pattern, the projection pattern comprising the convolution of a device pattern and a correction kernel.

According to a still further embodiment of the invention, there is provided a projection lithography apparatus having a patterning array of individually controllable elements, a projection system, and a pattern corrector. The patterning array of individually controllable elements is settable to three or more states that are configured to modulate a beam. The projection system projects the beam onto a substrate to print a pattern thereon defined by the modulation effected by the patterning array. The pattern corrector receives a two-level device pattern and convolutes the device pattern with a correction kernel to generate correction features having intensity levels of at least one level between the levels of the device pattern.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

Figure 1:
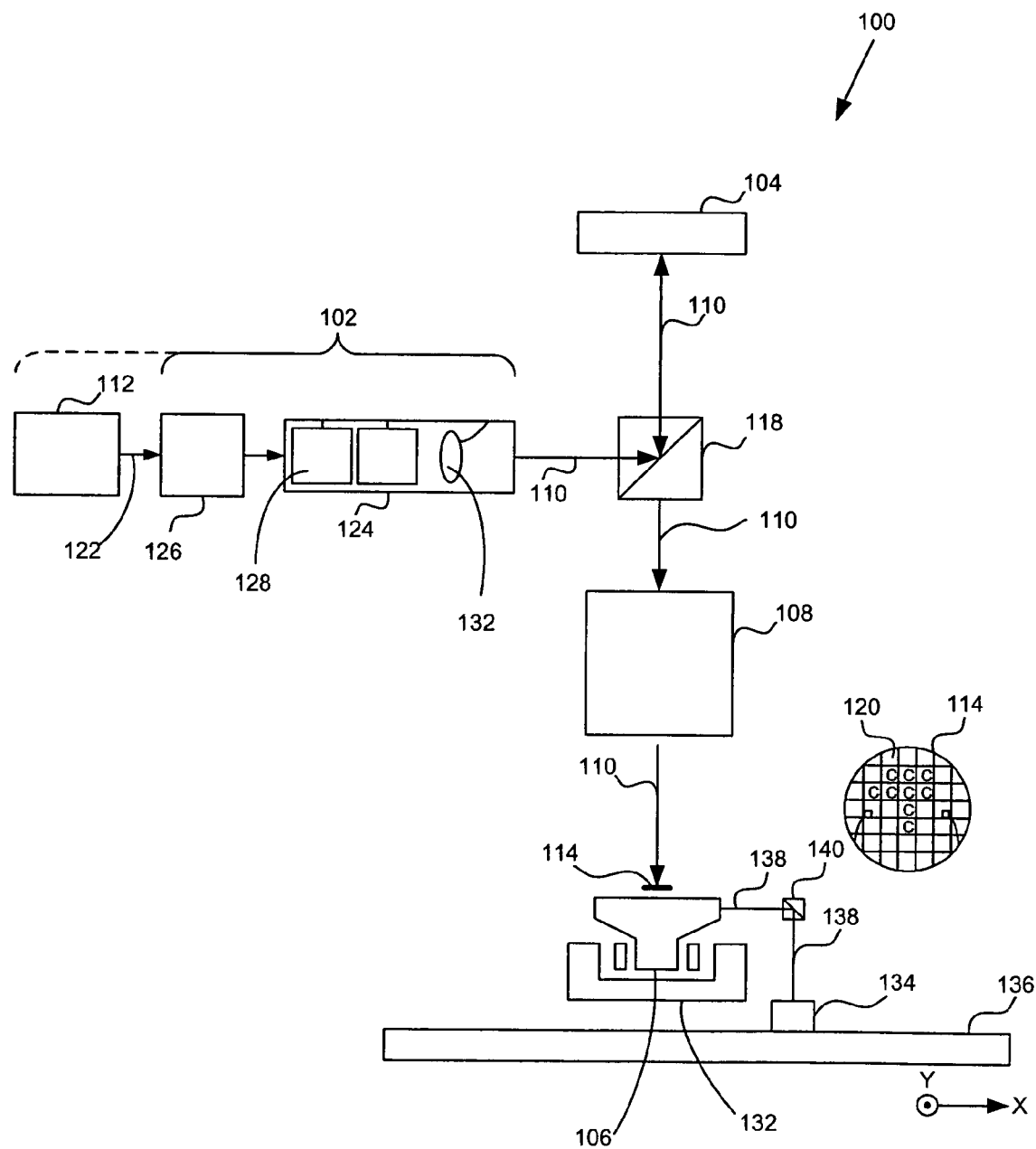
FIG. 1 depicts a lithographic apparatus, according to one embodiment of the present invention.

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus maybe of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 maybe used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

As discussed above, by adding additional small features, commonly termed Optical Proximity Correction or OPC features, near to or in contact with device features, the printed image on substrate 114 can be improved. Various different forms of OPC features have been described. Example OPC features include, but are not limited to, scattering bars, ladder bars, hammerheads, serifs, etc., for use in different circumstances. For example, scattering bars can be used so that the spatial frequencies of isolated or semi-isolated lines are nearer those of dense lines in the same pattern, bringing the process windows for different pitches in the same pattern closer together.

It should be noted that the term "OPC feature" is often used to encompass correction features that are not intended to correct proximity effects and, unless the context otherwise indicates, the terms "Optical Proximity Correction features," "OPC features," and "correction features" should be regarded as synonymous and intended to encompass all features that modify the developed image but are not themselves discernable in the developed image.

It is generally a requirement that the OPC features themselves do not print in the resist. This is achieved by making the OPC features significantly smaller in than the critical dimension (CD). Thus, due to diffraction around the OPC feature, the contrast in an aerial image is reduced. The exposure dose and resist threshold are then chosen so that the desired printing features (i.e., the device features and any other features, for example marks or targets that are intended to appear in the developed resist) expose the resist, but the OPC features do not. It should be noted however that in some cases the OPC features may in fact exceed the resist threshold but result in features that are washed away in development of the resist.

In an intensity-contrast device 104, which may be, for example, a mask, a programmable patterning device, or the like, the features (both printing features and OPC features) are defined by having a different intensity level than the background (e.g. dark features on a bright background) and an image of the device is projected onto substrate 114. In one example, for maximum contrast the dark features are completely dark, for example as is the case with a conventional chrome on quartz mask.

Exemplary Contrast Device Including Print Features and Correction Features

Figure 2:
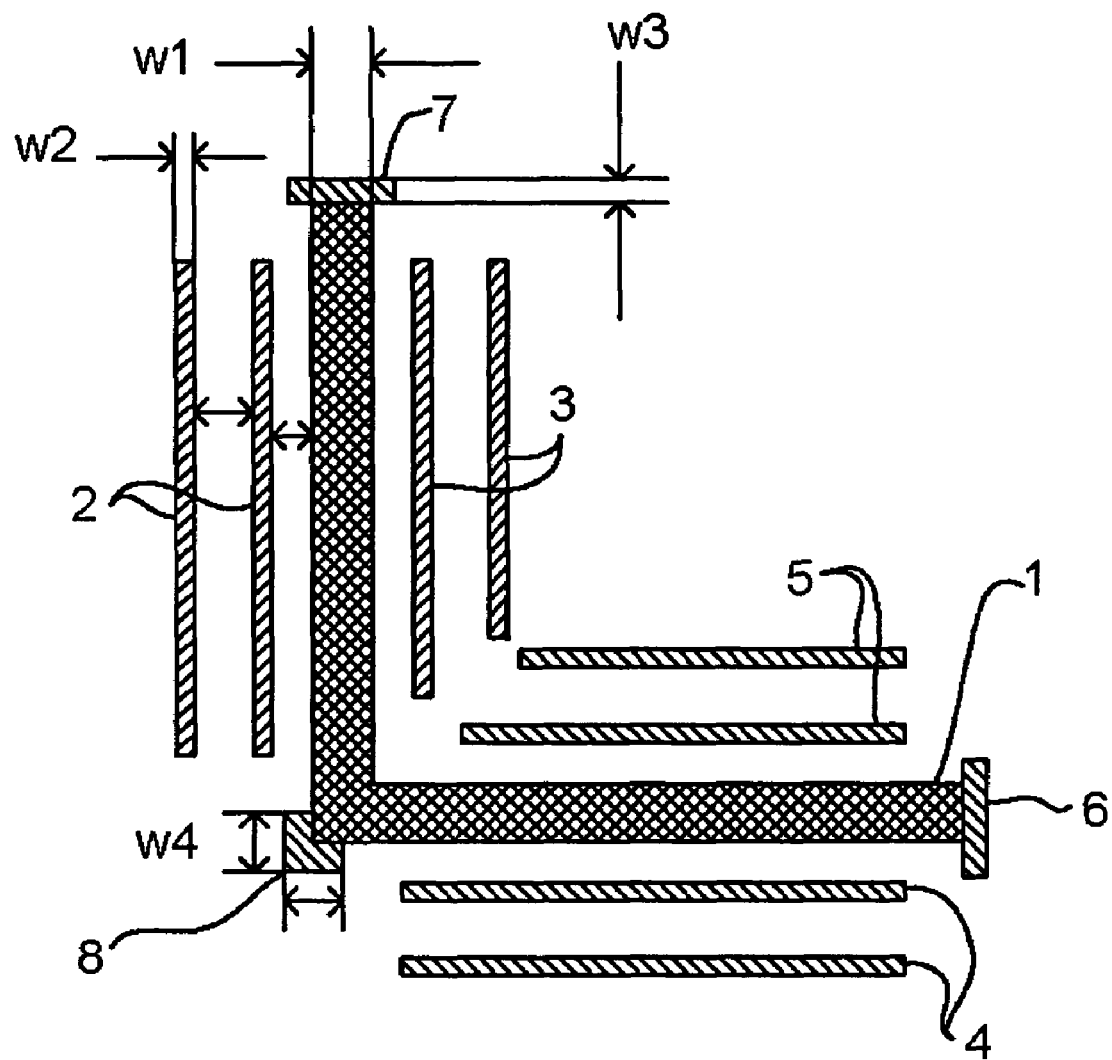
FIG. 2 depicts a part of a mask pattern generated by a method, according to one embodiment of the present invention.

FIG. 2 depicts a part of a mask pattern generated by a method, according to one embodiment of the present invention. In this embodiment, the correction features are set at an intermediate intensity level, that is between the intensity level of the printing features and the intensity level of the background. A dark L-shaped printing feature 1 is set against a bright background or field. In one example, printing feature 1 is completely dark, having a transmissivity, reflectivity or emmissivity of about zero according to whether the contrast-device is transmissive, reflective or self-emissive, or as dark as possible. At the same time the bright background is as bright as possible, having a transmissivity, reflectivity or emmissivity as high as possible. With dark features on a bright background, a positive tone resist is used, that is a resist which is washed away in development where it has been exposed. The intensity levels are reversed if a negative tone resist is used, that is one where the resist remains after development only where it has been exposed. Thus, in general, printing features 1 may be described as being defined by areas of a first intensity level against a background of a second intensity level.

In this embodiment, various types of correction features are provided around printing feature 1, including scattering bars 2-5, hammerheads 6 and 7 and a serif 8. The correction features 2-8 are defined by areas of a third, or intermediate, intensity level, that is an intensity level between the first and second intensity levels. In an example, the first intensity level is substantially zero, the second intensity level is Imax (e.g., a maximum intensity level for a particular application) and the third intensity level is approximately 0.5*Imax. In various examples, the third intensity level may be set to any desired or convenient level between the first and second intensity levels, and different correction features may have different intensity levels.

In one example, some correction features will have the same intensity level as printing features 1.

The correction features may also have either the same phase as the printing features 1 or be out of phase. Out-of-phase correction features may be described as being negativegray. The option of adjusting the phase of the correction features provides additional flexibility in providing correction features.

By defining the correction features with one or more intermediate intensity levels, constraints on the dimensions of the correction features are reduced or eliminated. If the intermediate intensity level is lower than the resist threshold, i.e., not sufficient in the given exposure to develop the resist, the correction features can be made as large as printing features 1. Even if the intermediate intensity level is above the resist threshold, the correction feature can be made larger than if it were defined at the same intensity level as printing features, and still not be discernable in the developed image.

These scenarios discussed above are desirable for at least a few reasons. Firstly, the relaxation or elimination of the constraints on the dimensions of the correction features can allows for greater flexibility in the design of correction features, which can allows for a better end result. Secondly, the larger correction features may be easier to manufacture in the mask and may be physically more robust. Thirdly, it can enable correction features to be defined in a programmable patterning means having a resolution comparable to the critical dimension, which has not previously been possible.

There are several ways in which the correction features may be defined with an intermediate level, depending on the contrast device used.

In one example, programmable patterning devices are inherently capable of producing a plurality, or a continuum of, intensity levels. For example, an array of diffractive optical MEMS devices (sometimes referred to as a grating light valve) can define multiple different intensity levels according to a position of the moveable ribbons. Spacing between the fixed and moveable ribbons determines the proportion of the incident light directed into the zeroth and higher order diffracted beams.

In one example, programmable patterning devices may be used in a mode in which a switching speed of the device is faster than the exposure time and/or the scanning speed. In this example, a time duration a given element is "on" in an exposure or its duty ratio determines a net intensity level.

In one example, an absorber thickness of a mask of or a multi-layer thickness in a reflective mask may be varied to define different intensity levels.

Exemplary Processes to Determine Correction Feature Parameters

Figure 3:
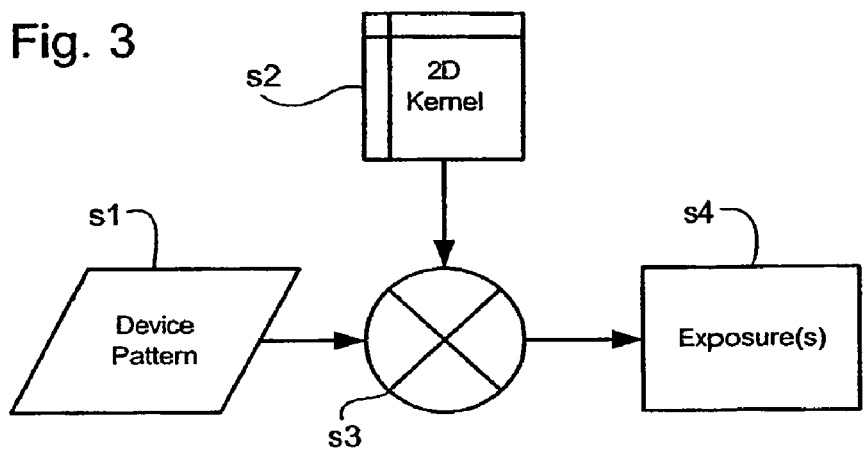
FIGS. 3, 4 and 5 depict methods of generating a mask pattern, according to various embodiments of the present invention.
Figure 4:
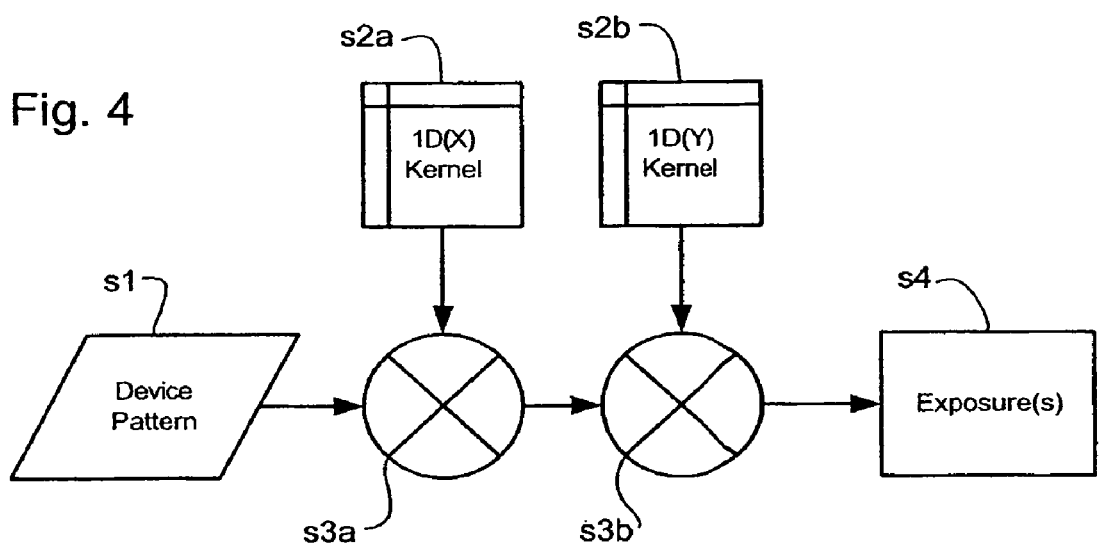
Figure 5:
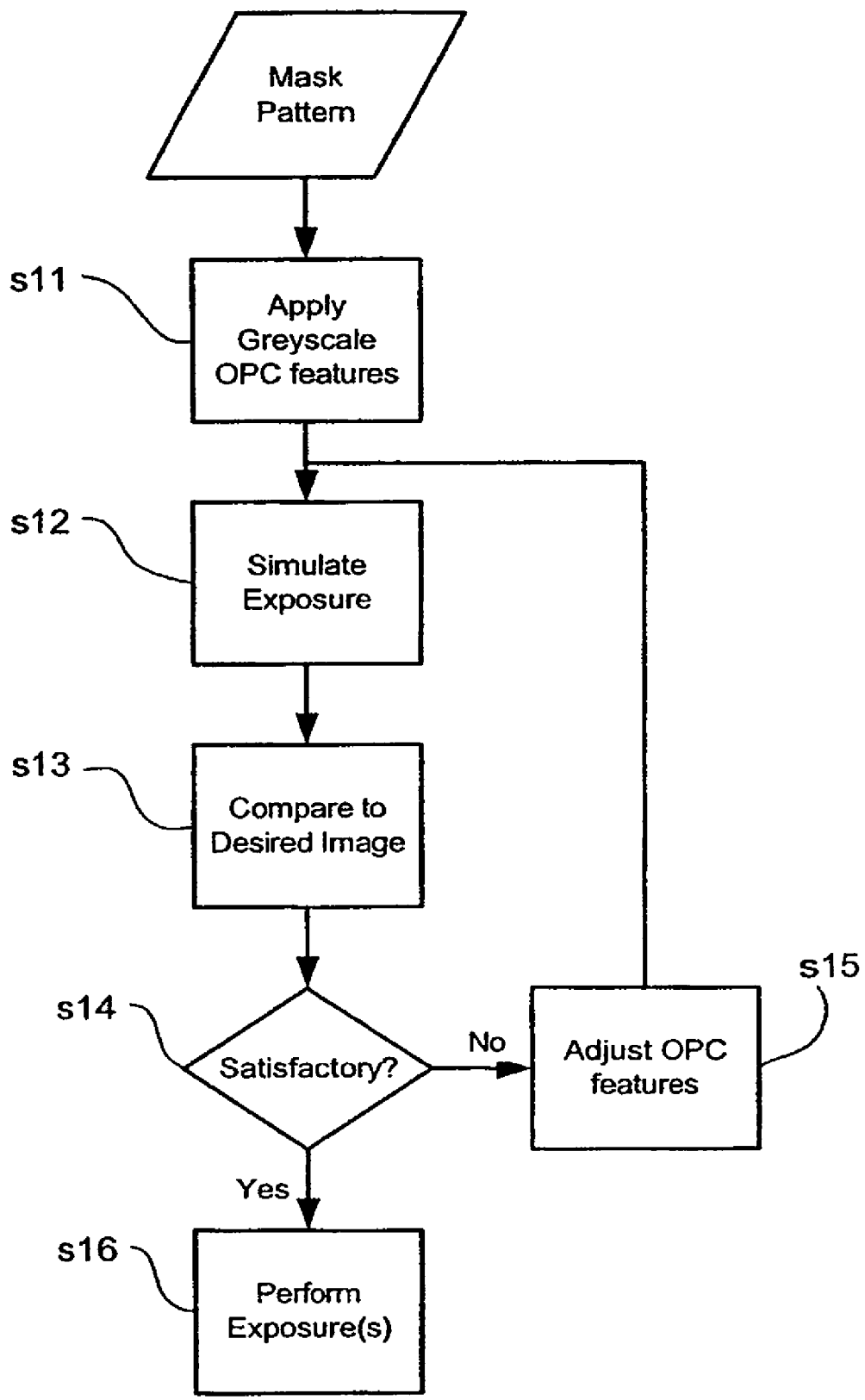

FIGS. 3, 4 and 5 depict methods of generating a mask pattern, according to various embodiments of the present invention. These methods can be performed in software, hardware, firmware, or the like, and combinations thereof.

FIG. 3 shows an automated process used to determine appropriate correction features to be applied to a given device pattern, according to one embodiment of the present invention. A desired device pattern, which may also include non-functional printing features, is input s1 to an input device (not shown). For example, the input device can be, but is not limited to, a network interface or a reader for a computer-readable storage medium. A correction kernel, which is determined to generate appropriate spatial frequencies for a given lithographic apparatus and/or illumination conditions, is supplied from a storage device s2, which may store a plurality of different kernels for different apparatus and/or conditions, or the kernel is generated by an algorithm for determining the appropriate correction kernel according to input parameters relating to the apparatus and/or illumination conditions. The kernel is then convoluted with device pattern s1 in a multiplier s3 to generate a projection pattern, which is used during exposure(s) s4. In one example, the correction features in the projection pattern may have intensity levels that vary according to sinusoidal or other smooth curves, which may be approximated as closely as possible within the confines of the resolution and number of available intensity levels of the pattering device used.

FIG. 4 shows an automated process used to determine appropriate correction features to be applied to a given device pattern, according to one embodiment of the present invention. In FIG. 4, first and second one-dimensional kernels are supplied or generated in s2a and s2b and sequentially convoluted with device pattern in multipliers s3a and s3b. In one example, the one-dimensional kernels are orthogonal, e.g. one generates features in the X-direction around lines extending in the Y direction and the other generates features in the Y direction around lines extending in the X direction. In one example, if a pattern contains only lines extending in one direction, it is possible to use only a single one-dimensional kernel.

In one example, the correction features maybe inserted in a rules-based or model-based procedure. In a rules based procedure, at least one predetermined rule is used to determine the insertion of correction features. For example, a rule may take the form: if a line is isolated, then insert a correction feature on each side of intensity I and having a width W at a distance D from the line. A model-based approach uses one or more formulae to determine the intensity (and/or phase) of a correction feature to be inserted at a given position as a function of the proximity of printing features.

FIG. 5 shows a flowchart depicting a method, according to one embodiment of the present invention. In this embodiment, additional degrees of freedom provided by the possibility of an intermediate intensity level correction features according to the invention allow for an iterative approach to the generation of correction features. In step s11, an input device pattern has OPC features applied, according to a rules-based or predetermined procedure. These may be grayscale, i.e., having intermediate intensity levels, or binary as an initial approximation. In step s12, simulation of an exposure using the projection pattern is carried out. In step s13, the simulated image is compared to a desired image. In step s14, a determination is made as to whether the result is satisfactory. If yes, in step s16 an exposure(s) is (are) performed. If the simulated exposure is not considered satisfactory, in step s15 the OPC features are adjusted and the process returns to step s12 to repeat the simulation, comparison and determination steps are repeated.

In one example, the cycle is repeated until a desired quality of image is achieved or for a predetermined number of cycles.

In various examples, the adjustment step s15 of the OPC features maybe rules-based, predetermined or based on the simulation results.

In one example, the simulation and comparison results are used to calculate a correction kernel, which is applied to the pattern produced by the previous iteration.

In one example, the initial application of OPC features step s11 may be omitted and the cycle begins with a simulated exposure.

In one example, results of actual exposures may be used in place of the simulated exposures.

The basic criterion for determining whether the mask image is suitable for use is that its simulated image is as close as possible to the desired pattern to be printed, i.e., deviation from the desired pattern is minimized. Deviation may be measured in any convenient or suitable way, for example by the sum over all pixels of the difference between the squares of the intensities of the desired pattern and the projected image.

Exemplary Computer System

The processes of the invention for generating projection patterns, whether single step of iterative, may be effected by computer programs which may be written by those skilled in the art in any suitable programming language and executed on any suitable computer, which may be a stand-alone device or part of the control system of a lithographic apparatus. The programs may be stored on suitable computer-readable storage media and transmitted over suitable communications networks.

Figure 6:
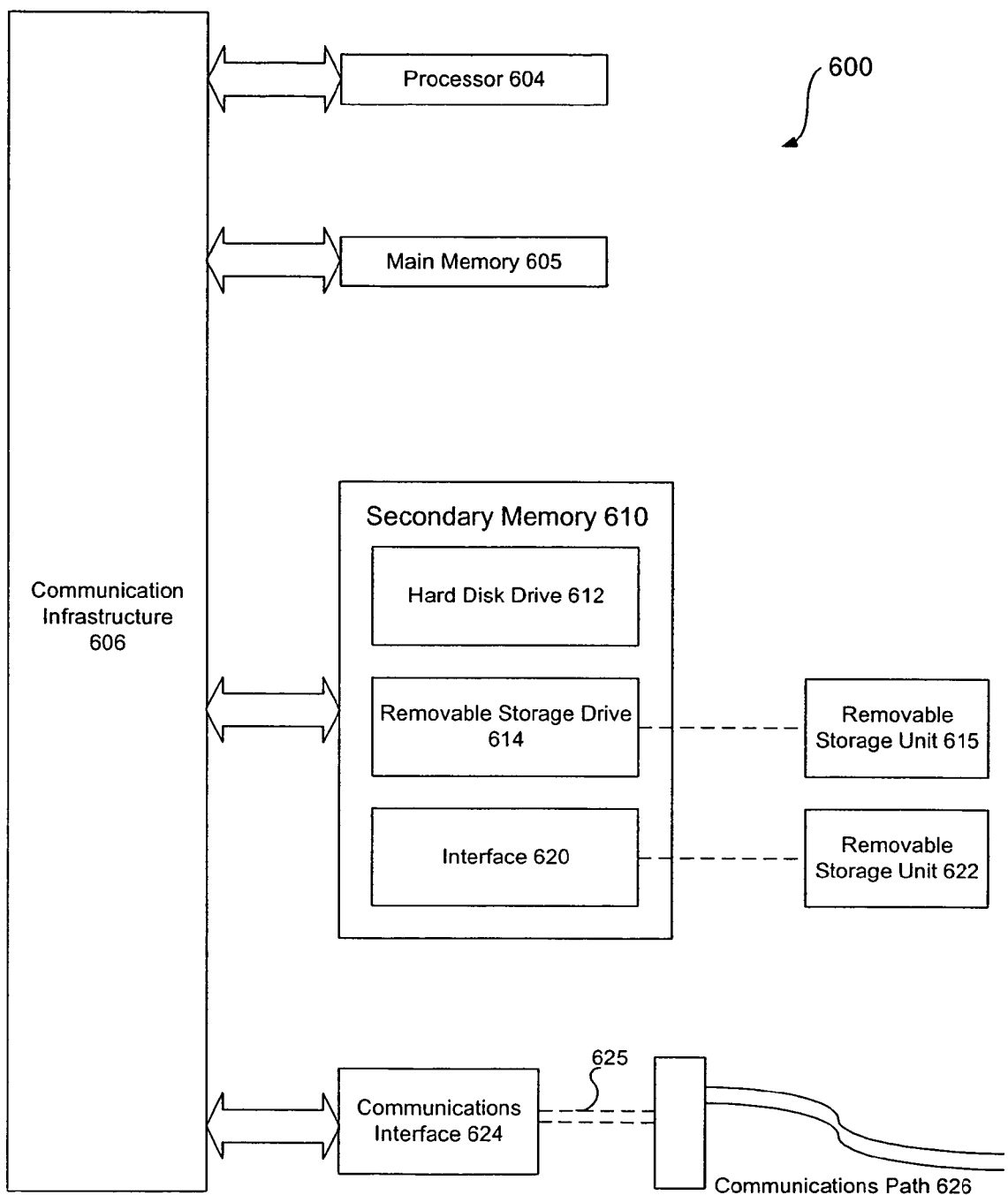
FIG. 6 shows an exemplary computer system, according to one embodiment of the present invention.

FIG. 6 illustrates an example computer system 600, in which the present invention can be implemented as computer-readable code. Various embodiments of the invention are described in terms of this example computer system 600. After reading this description, it will become apparent to a person skilled in the relevant art how to implement the invention using other computer systems and/or computer architectures.

The computer system 600 includes one or more processors, such as processor 604. Processor 604 can be a special purpose or a general purpose digital signal processor. The processor 604 is connected to a communication infrastructure 606 (for example, a bus or network). Various software implementations are described in terms of this exemplary computer system. After reading this description, it will become apparent to a person skilled in the relevant art how to implement the invention using other computer systems and/or computer architectures.

Computer system 600 also includes a main memory 608, preferably random access memory (RAM), and may also include a secondary memory 610. The secondary memory 610 may include, for example, a hard disk drive 612 and/or a removable storage drive 614, representing a floppy disk drive, a magnetic tape drive, an optical disk drive, etc. The removable storage drive 614 reads from and/or writes to a removable storage unit 618 in a well known manner. Removable storage unit 618, represents a floppy disk, magnetic tape, optical disk, etc. which is read by and written to by removable storage drive 614. As will be appreciated, the removable storage unit 618 includes a computer usable storage medium having stored therein computer software and/or data.

In alternative implementations, secondary memory 610 may include other similar means for allowing computer programs or other instructions to be loaded into computer system 600. Such means may include, for example, a removable storage unit 622 and an interface 620. Examples of such means may include a program cartridge and cartridge interface (such as that found in video game devices), a removable memory chip (such as an EPROM, or PROM) and associated socket, and other removable storage units 622 and interfaces 620 which allow software and data to be transferred from the removable storage unit 622 to computer system 600.

Computer system 600 may also include a communications interface 624. Communications interface 624 allows software and data to be transferred between computer system 600 and external devices. Examples of communications interface 624 may include a modem, a network interface (such as an Ethernet card), a communications port, a PCMCIA slot and card, etc. Software and data transferred via communications interface 624 are in the form of signals 625 which may be electronic, electromagnetic, optical or other signals capable of being received by communications interface 624. These signals 625 are provided to communications interface 624 via a communications path 626. Communications path 626 carries signals 625 and may be implemented using wire or cable, fiber optics, a phone line, a cellular phone link, an radio frequency (RF) link and other communications channels.

In this document, the terms "computer program medium" and "computer usable medium" are used to generally refer to media such as removable storage drive 614, a hard disk installed in hard disk drive 612, and signals 625. Computer program medium and computer usable medium can also refer to memories, such as main memory 608 and secondary memory 610, that can be memory semiconductors (e.g. a dynamic random access memory (DRAM), etc.) These computer program products are means for providing software to computer system 600.

Computer programs (also called computer control logic) are stored in main memory 608 and/or secondary memory 610. Computer programs may also be received via communications interface 624. Such computer programs, when executed, enable the computer system 600 to implement the present invention as discussed herein. In particular, the computer programs, when executed, enable the processor 604 to implement the processes of the present invention, such as operations in one or more elements in system 100, as depicted by Figures, and operations discussed as exemplary operations of system 100 above, as depicted in FIGS. 3-5. Accordingly, such computer programs represent controlling systems of the computer system 600. Where the invention is implemented using software, the software may be stored in a computer program product and loaded into computer system 600 using removable storage drive 614, hard drive 612 or communications interface 624.

The invention is also directed to computer products (also called computer program products) comprising software stored on any computer useable medium. Such software, when executed in one or more data processing device, causes the data processing device(s) to operation as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.). It is to be appreciated that the embodiments described herein can be implemented using software, hardware, firmware, or combinations thereof.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of generating a mask pattern for controlling an array of individually controllable elements, comprising:
    (a) receiving a device pattern representing one or more features to be printed; and (b) generating the mask pattern comprising the one or more features from the device pattern having a first intensity level against a background having a second intensity level and at least one correction feature having a third intensity level, the third intensity level being between the first and second intensity levels, whereby the generated mask pattern is configured to be used to pattern a substrate by controlling elements of the array of individually controllable elements.

2. The method of claim 1, wherein step (b) comprises:
(b1) convoluting the device pattern with a correction kernel.

3. The method of claim 2, wherein the correction kernel is two dimensional.

4. The method of claim 2, wherein the correction kernel is one dimensional and step (b) further comprises:
(b2) convoluting the device pattern with a second correction kernel, the second correction kernel being one dimensional and orthogonal to the correction kernel.

5. The method of claim 1, wherein the generating comprises inserting correction features according to at least one predetermined rule.

6. The method of claim 1, wherein step (b) comprises:
(b1) inserting correction features based on correlating intensity of the correction feature to proximity of printing features.

7. The method of claim 1, further comprising:
(c) generating a data file formatted to be used in control of the array of individually controllable elements to impart the mask pattern to a beam.

8. The method of claim 1, further comprising:
(c) simulating an aerial image that would be produced on projection of the mask pattern in a lithographic projection apparatus;
(d) comparing the simulated aerial image to the device pattern; and
(e) modifying the mask pattern so that a modified aerial image of the modified mask pattern more closely resembles the device pattern.

9. The method of claim 8, wherein step (e) comprises:
(e1) generating, based on the results of step (d), a correction kernel; and
(e2) convoluting the mask pattern with a correction kernel to generate the modified mask pattern.

10. The method of claim 8, wherein steps (c)-(e) are repeated a predetermined number of times.

11. The method of claim 8, wherein steps (c)-(e) are repeated until a result of the comparing is below a predetermined threshold.

12. A device manufacturing method for controlling an array of individually controllable elements of a maskless lithography tool, comprising:
(a) receiving a device pattern representing features to be printed;
(b) generating a mask pattern comprising device features having a first intensity level against a background having a second intensity level and at least one correction feature having a third intensity level, the third intensity level being between the first and second intensity levels;
(c) using the array of individually controllable elements to spatially modulate a beam according to the mask pattern; and
(d) projecting the patterned beam of radiation onto a target portion of a substrate.

13. The method of claim 12, wherein step (b) comprises: convoluting the device pattern with a correction kernel.

14. The method of claim 13, wherein the correction kernel is two dimensional.

15. The method of claim 13, wherein the correction kernel is one dimensional and step (b) further comprises:
(b2) convoluting the device pattern with a second correction kernel, the second correction kernel being one dimensional and orthogonal to the correction kernel.

16. The method of claim 12, wherein step (b) comprises:
inserting correction features according to at least one predetermined rule.

17. The method of claim 12 wherein step (b) comprises:
inserting correction features through correlating of intensity of the correction feature to proximity of printing features.

18. The method of claim 12, further comprising:
(e) generating a data file formatted to be used in control of a the array of individually controllable elements to impart the mask pattern to a beam.

19. The method of claim 12, further comprising:
(e) simulating an aerial image that would be produced on projection of the mask pattern in the maskless lithography tool;
(f) comparing the simulated aerial image to the device pattern; and
(g) modifying the mask pattern so that a modified aerial image of the modified mask pattern more closely resembles the device pattern.

20. The method of claim 19 wherein step (g) comprises:
(g1) generating, based on the results of step (f), a further correction kernel; and
(g2) convoluting the mask pattern with a correction kernel to generate the modified mask pattern.

21. The method of claim 19 wherein steps (e)-(g) are repeated one or more times.

22. The method of claim 19 wherein steps (e)-(g) are repeated until the result of step (f) is below a predetermined threshold.

23. A maskless lithographic apparatus, comprising:
an illumination system that supplies a beam of radiation;
a patterning array of individually controllable elements that spatially modulate the beam thereby resulting in a patterned beam;
a projection system that projects the patterned beam onto a target portion of a substrate; and
a controller that controls the patterning array of individually controllable elements so that elements of the patterning array of individually controllable elements adopt one or more states representing a projection pattern, the projection pattern comprising a convolution of a device pattern and a correction kernel.

24. The apparatus of claim 23, wherein the controller receives data representing the device pattern and convolutes the device pattern and the correction kernel.

25. The apparatus of claim 24, wherein the controller convolutes the device pattern with a two dimensional form of the correction kernel.

26. The apparatus of claim 24, wherein the controller convolutes the device pattern with a one dimensional form of the correction kernel to generate an intermediate pattern and then convolutes the intermediate pattern with a second one dimensional correction kernel to generate the patterned beam.

27. The apparatus of claim 23, wherein the patterning array of individually controllable elements modulates the beam with a pattern having three or more intensity levels.

28. The apparatus of claim 27, wherein the correction kernel generates correction features having at least one intensity level intermediate of a high and a low intensity level of the device pattern.

29. In a projection lithography apparatus having a patterning array of individually controllable elements settable to three or more states that modulates a beam and a projection system that projects the modulated beam onto a substrate to print a pattern thereon, without using a mask, defined by the modulation effected by the patterning array of individually controllable elements, a pattern corrector receives a two level device pattern and convolutes the device pattern with a correction kernel to generate correction features having intensity levels of at least one level between the levels of the device pattern.

* * * * *